United States Patent
Kanno et al.

(10) Patent No.: US 9,799,486 B2
(45) Date of Patent: Oct. 24, 2017

(54) CHARGED PARTICLE BEAM APPARATUS FOR MEASURING SURFACE POTENTIAL OF A SAMPLE

(71) Applicant: Hitachi High-Technologies Corporation, Minato-ku, Tokyo (JP)

(72) Inventors: Seiichiro Kanno, Tokyo (JP); Yasushi Ebizuka, Tokyo (JP); Go Miya, Tokyo (JP); Takafumi Miwa, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 126 days.

(21) Appl. No.: 14/796,113

(22) Filed: Jul. 10, 2015

(65) Prior Publication Data

US 2016/0013010 A1    Jan. 14, 2016

(30) Foreign Application Priority Data

Jul. 14, 2014   (JP) ................. 2014-143797

(51) Int. Cl.
   *G01F 23/00*   (2006.01)
   *H01J 37/21*   (2006.01)

(52) U.S. Cl.
   CPC ....... *H01J 37/21* (2013.01); *H01J 2237/0044* (2013.01); *H01J 2237/2007* (2013.01)

(58) Field of Classification Search
   CPC .. H01J 37/00; H01J 37/02; H01J 37/20; H01J 37/21; H01J 37/26
   USPC ... 250/440.11, 306, 307, 311, 442.11, 492.1, 250/492.2, 492.3
   See application file for complete search history.

(56) References Cited

U.S. PATENT DOCUMENTS

| 6,828,571 | B1* | 12/2004 | McCord ............. G01R 31/2653 250/307 |
| 2004/0043310 | A1* | 3/2004 | Takeishi ................ G03F 9/7076 430/22 |
| 2012/0235036 | A1* | 9/2012 | Hatakeyama ...... G01N 23/2251 250/310 |

FOREIGN PATENT DOCUMENTS

JP    2010-272586 A    12/2010

* cited by examiner

*Primary Examiner* — Jason McCormack
(74) *Attorney, Agent, or Firm* — Crowell & Moring LLP

(57) ABSTRACT

In a charged particle beam apparatus that applies a retarding voltage to a sample through a contact terminal and executes measurement or inspection of a surface of the sample, potential variation of the sample when changing the retarding voltage applied to the contact terminal is measured by a surface potential meter, a time constant of the potential variation of the sample is obtained, and it is determined whether execution of measurement or inspection by a charged particle beam continues or stops based on the time constant, or a conduction ensuring process between the sample and the contact terminal is executed.

9 Claims, 9 Drawing Sheets

[Fig. 1]
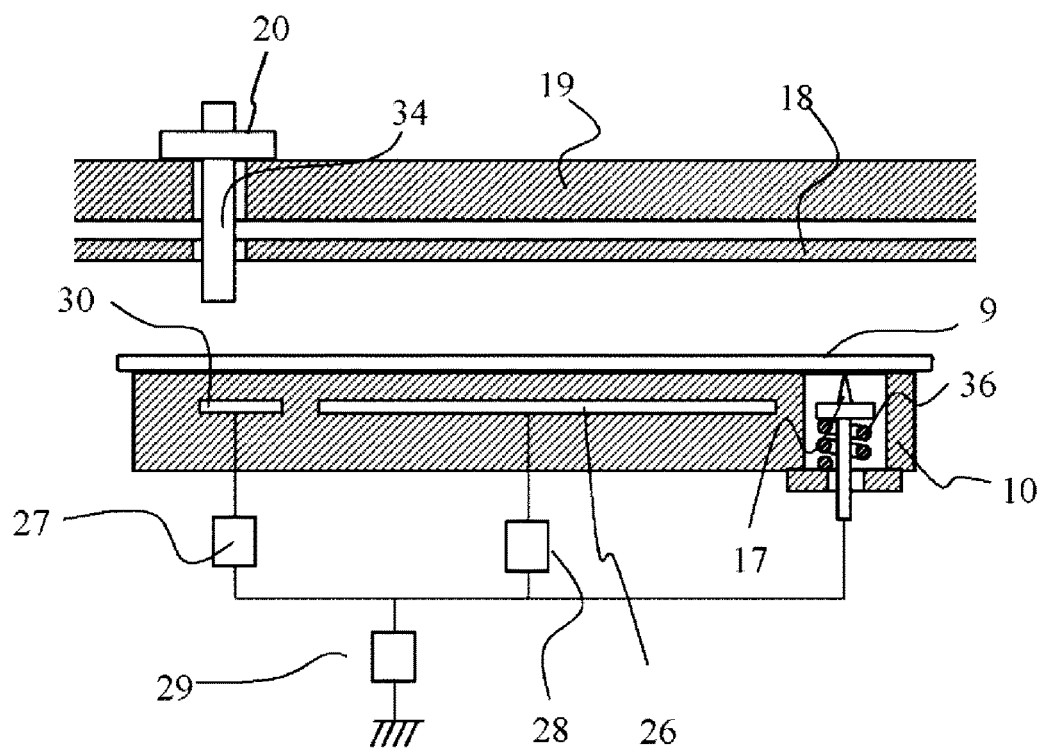

[Fig. 2]
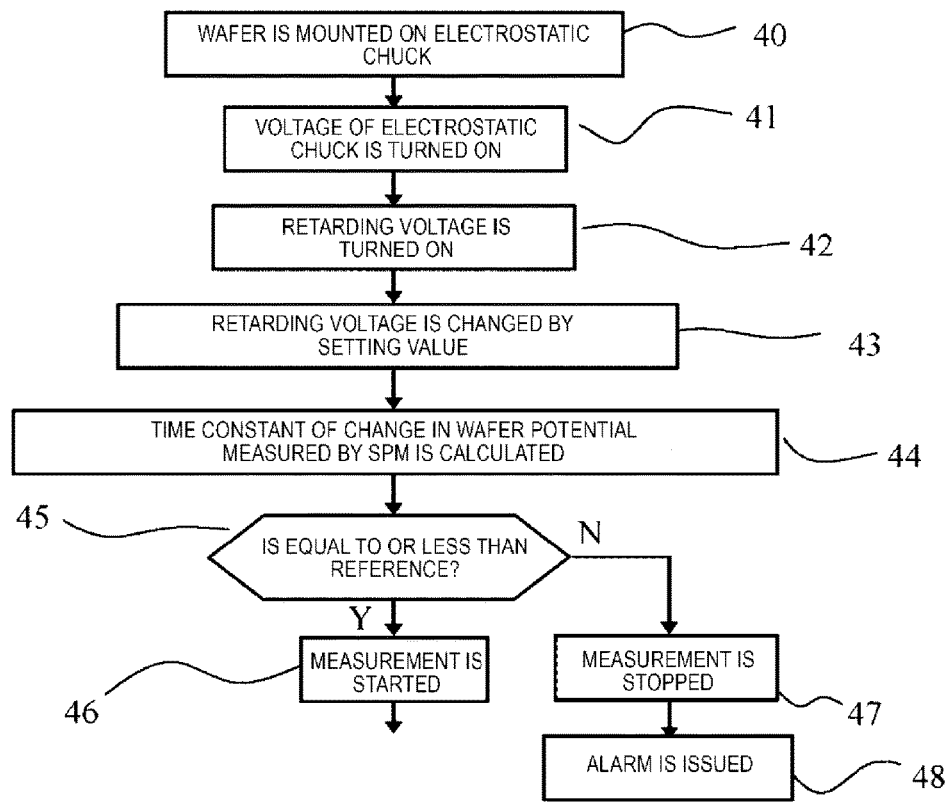

[Fig. 3]
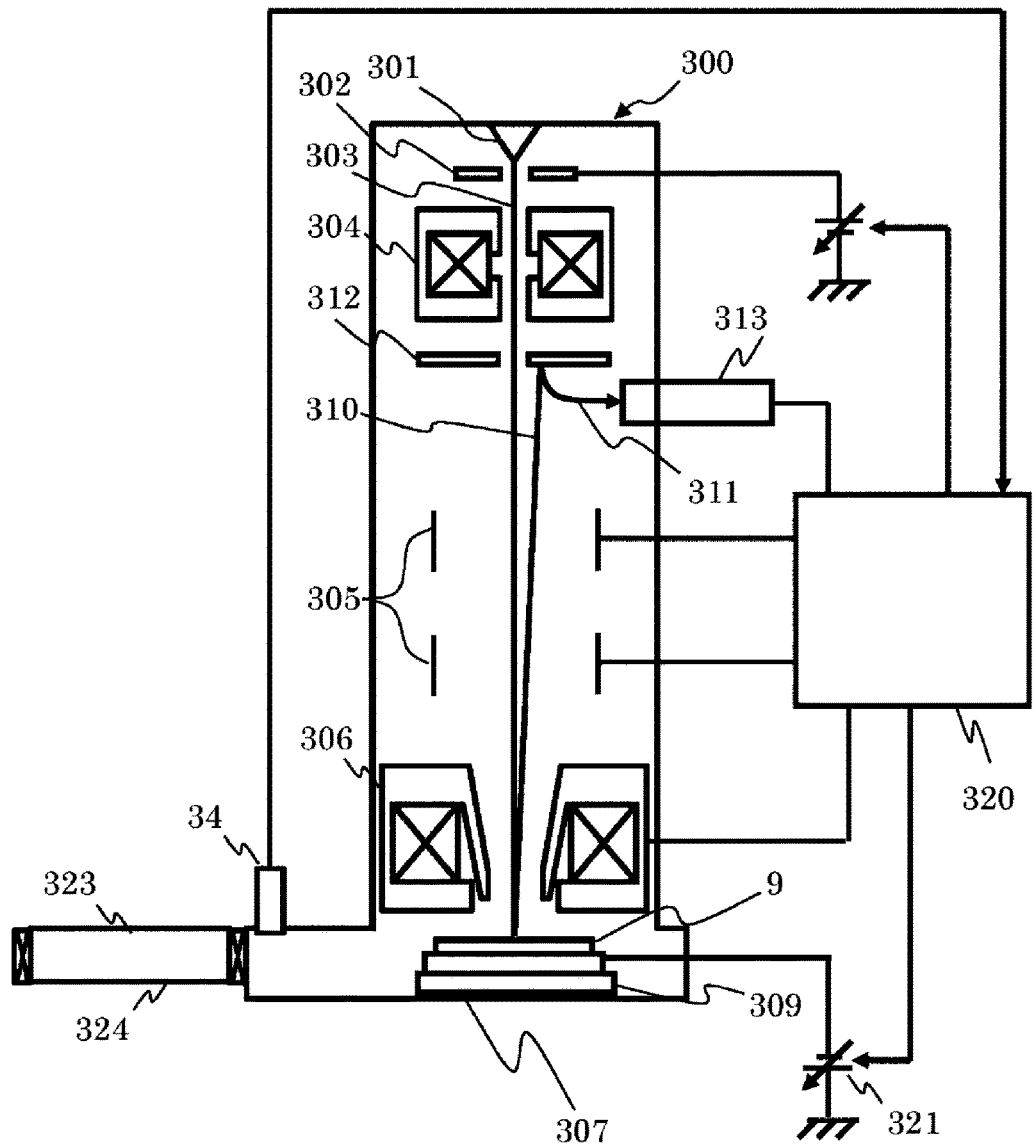

[Fig. 4]
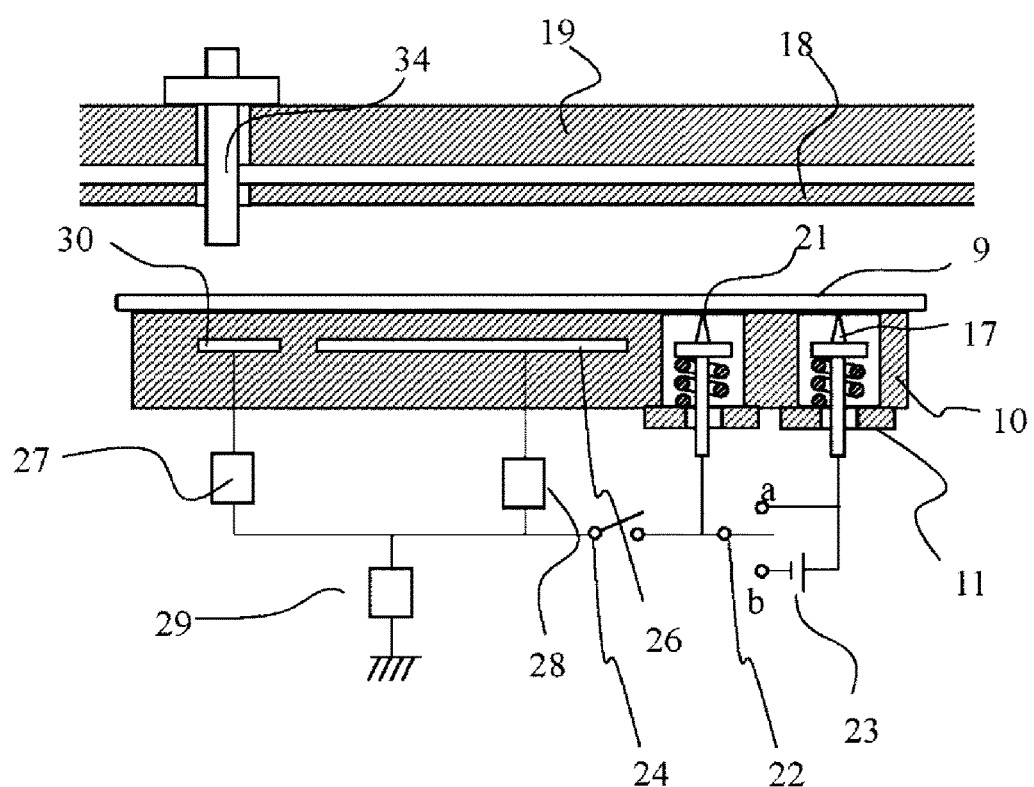

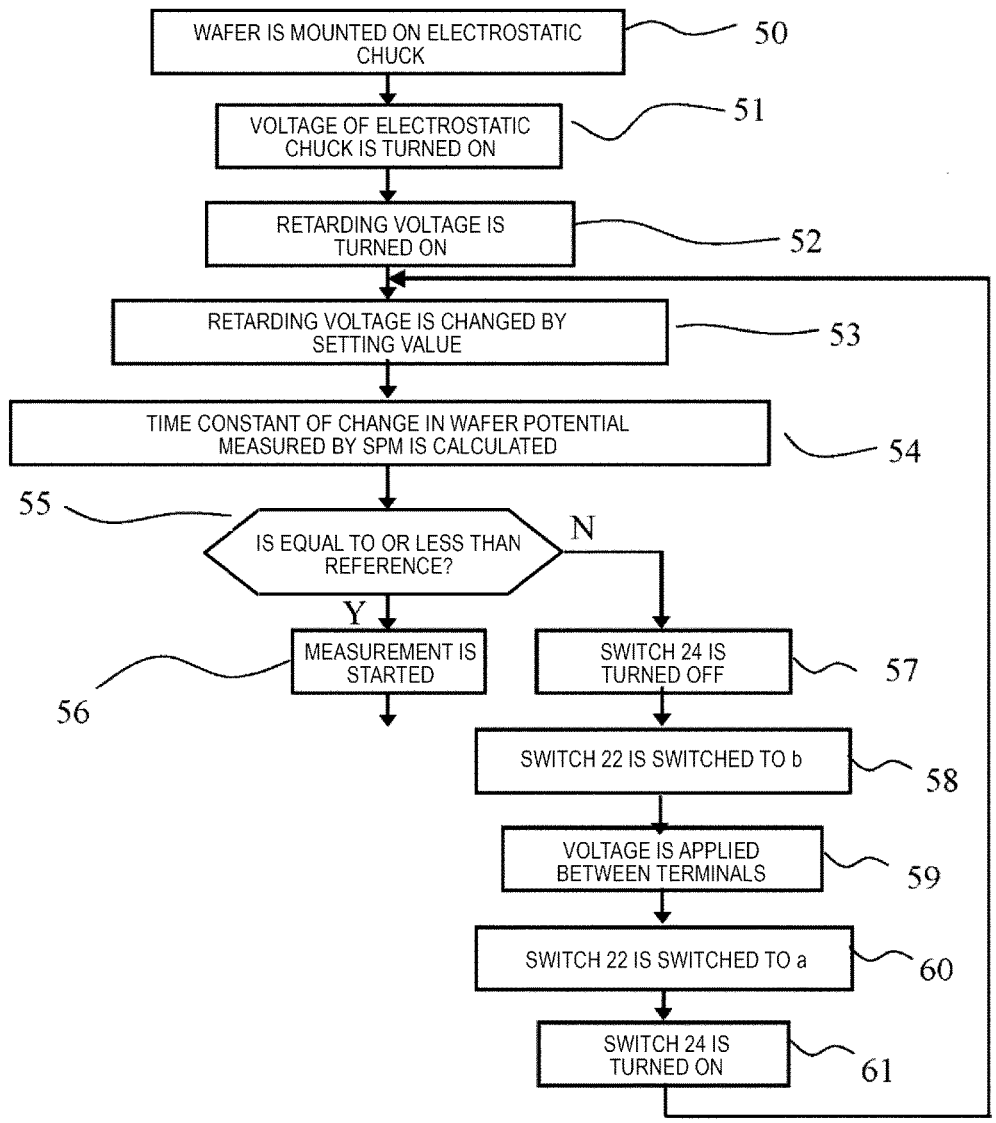
[Fig. 5]

[Fig. 6]
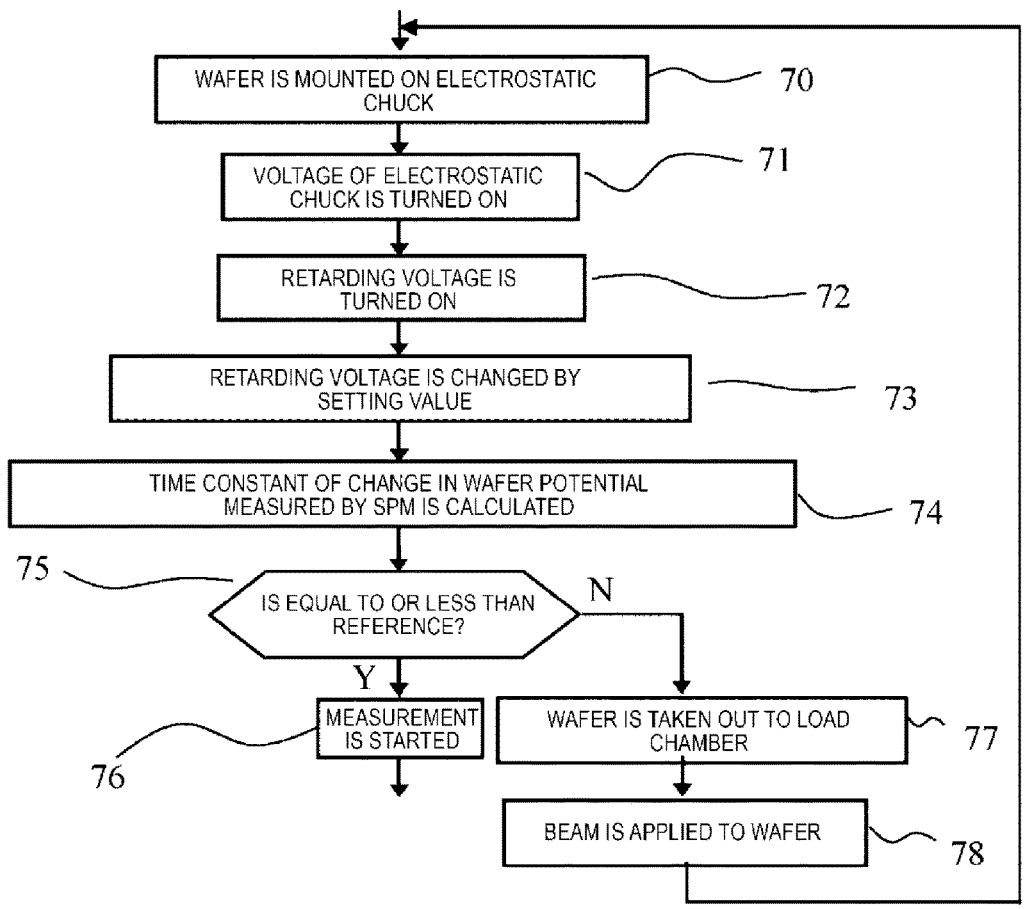

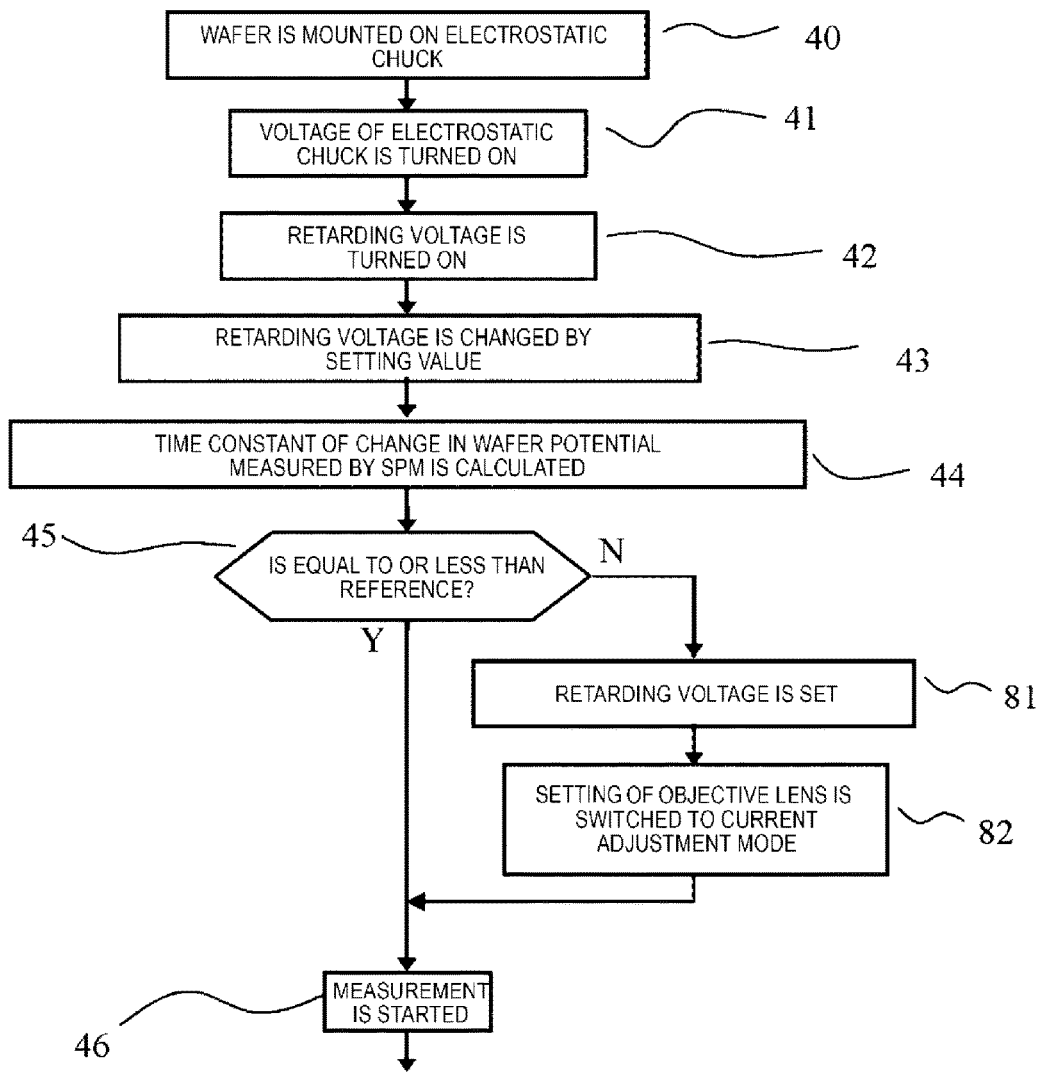
[Fig. 7]

[Fig. 8]
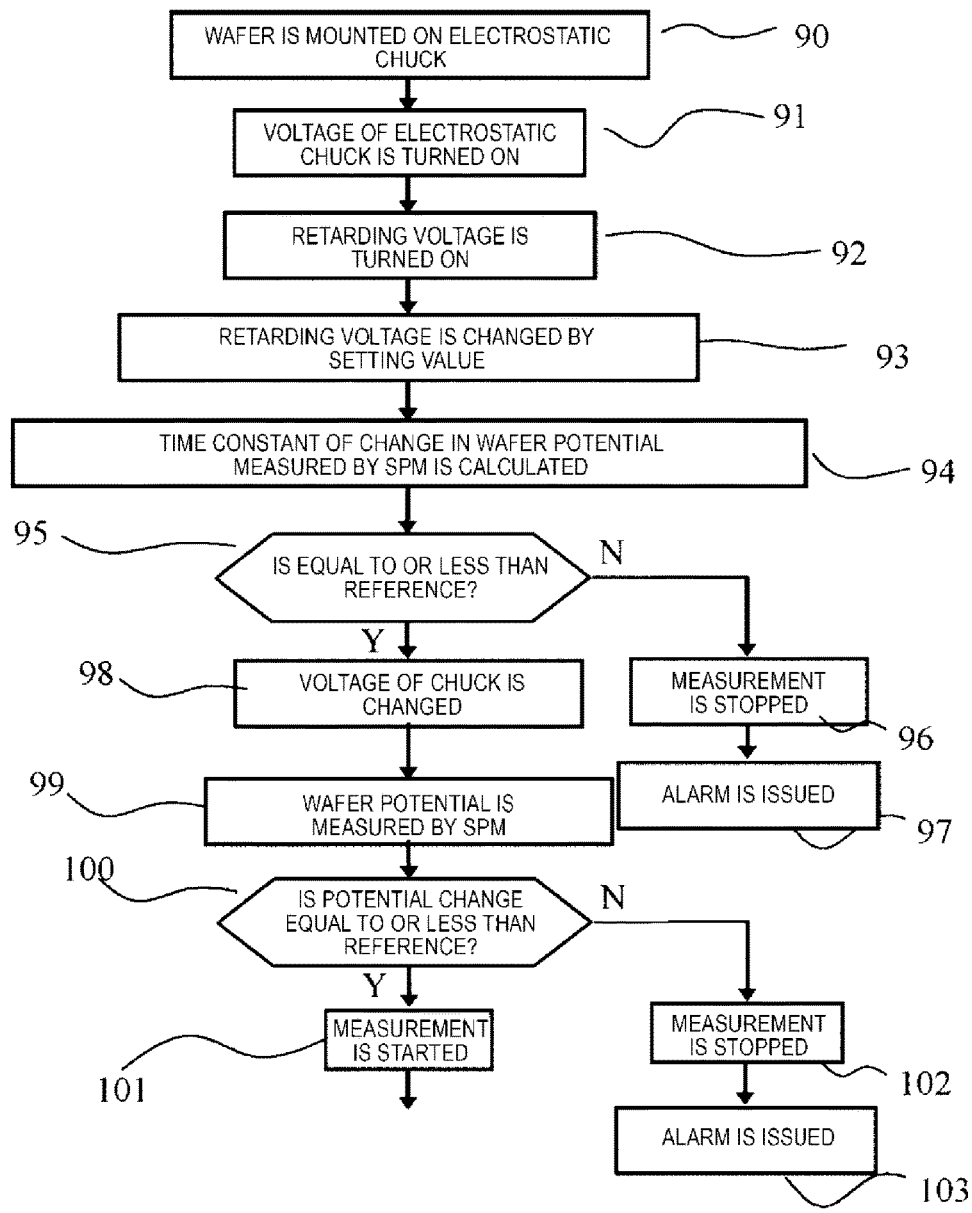

[Fig. 9]
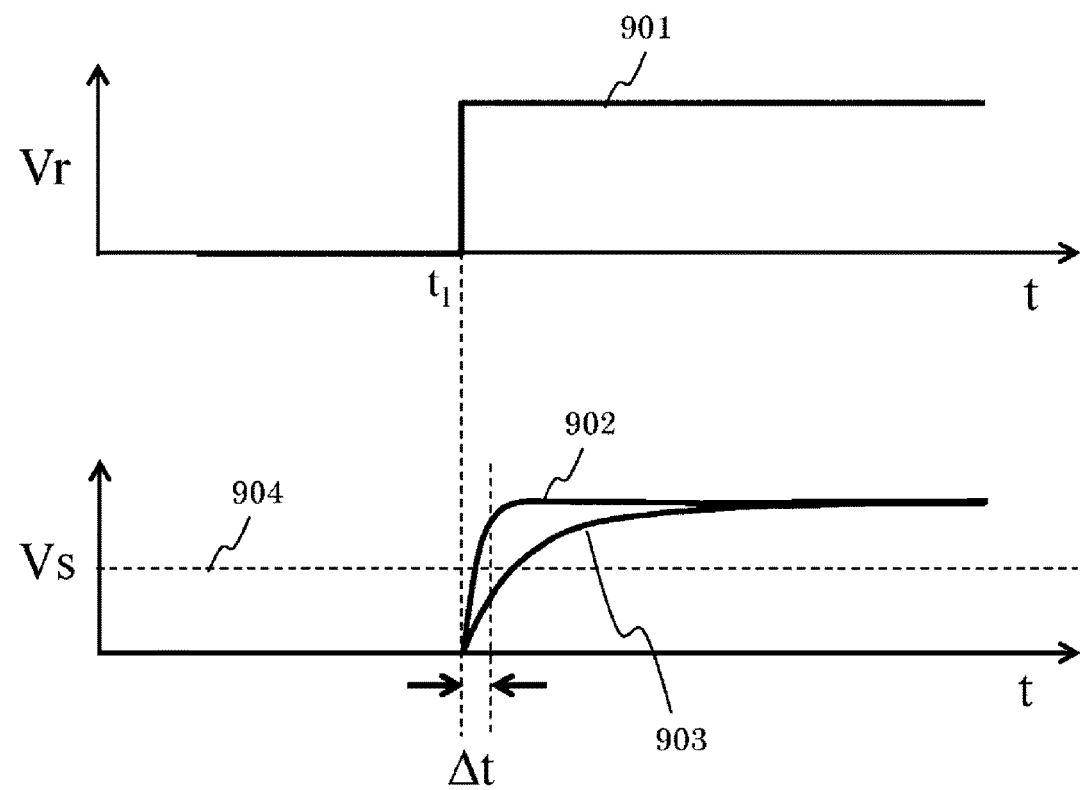

CHARGED PARTICLE BEAM APPARATUS FOR MEASURING SURFACE POTENTIAL OF A SAMPLE

TECHNICAL FIELD

The present invention relates to a charged particle beam apparatus for performing line width measurement, defect inspection, image acquisition, and the like of a semiconductor device and the like by using an electron beam or an ion beam, and particularly, to a charged particle beam apparatus including an electrostatic chuck mechanism holding a sample by electrostatic adsorption.

BACKGROUND ART

In recent years, an electron microscope that is a type of a charged particle beam apparatus has been applied to a dimension measurement or defect inspection of a semiconductor device pattern. For example, for measurement of a gate dimension of a semiconductor device, a length measuring Critical-Dimension Scanning Electron Microscope (SEM) (hereinafter, referred to as CD-SEM) is used and for the defect inspection, a defect inspection SEM is used. Furthermore, a scanning electron microscope is used for conduction inspection of a wiring deep hole by using a potential contrast. Furthermore, there is also a focusing ion beam apparatus for processing and observing the semiconductor device by using an ion beam.

On the other hand, a surface of a sample such as a semiconductor wafer or the like that is an object to be measured or inspected by the charged particle beam apparatus described above may be covered by an insulation film. If the beam is applied to the sample, a surface potential of the sample is increased, which may cause focus shift or image drift. In order to suppress such an increase in the potential, an electrostatic chuck in which a contact pin is provided to break the insulation film of the surface of the sample is disclosed in PTL 1. Furthermore, in order to determine whether or not the contact pin and the sample are appropriately conductive, a method of evaluating a shift amount of a retarding voltage is described in PTL 1.

CITATION LIST

Patent Literature

PTL 1: JP-A-2010-272586

SUMMARY OF INVENTION

Technical Problem

As disclosed in PTL 1, it is possible to perform determination of conduction and non-conduction by evaluating the shift amount of the retarding voltage. However, a contact resistance between the contact pin and the sample is changed by a thickness of the insulation film or a contact state of the contact pin. If the contact resistance is great, a response speed of a change in the potential of the sample with respect to a change in the retarding voltage is decreased. As a result, so-called retarding focus in which the retarding voltage is changed, and thereby performing focus adjustment may not be appropriately performed.

Hereinafter, a charged particle beam apparatus for the purpose of setting of appropriate optical conditions or setting of measurement or inspection conditions depending on the contact state of a contact pin is described.

Solution to Problem

According to an aspect of the present invention, there is provided a charged particle beam apparatus including: an objective lens for focusing a charged particle beam emitted from a charged particle source; a sample stand for mounting a sample to which a charged particle beam focused by the objective lens is applied; a voltage applying power supply for applying a voltage to the sample; and a control device for controlling the objective lens and the voltage applying power supply, in which after the voltage is applied from the voltage applying power supply to the sample, the control device measures a surface potential of the sample after a predetermined period of time, a change in the surface potential of the sample after the voltage is applied, or a time constant, and executes focus adjustment of the charged particle beam based on the adjustment of the voltage applying power supply if the surface potential of the sample after the predetermined period of time, information of a change in the surface potential of the sample after the voltage is applied, or the time constant satisfies predetermined conditions.

Advantageous Effects of Invention

According to the configuration described above, it is possible to set appropriate apparatus conditions depending on the contact state of the contact pin.

BRIEF DESCRIPTION OF DRAWINGS

FIG. 1 is a view illustrating an outline of an electrostatic chuck mechanism.

FIG. 2 is a flowchart illustrating a measuring process of a sample by a charged particle beam apparatus.

FIG. 3 is a view illustrating an example of a scanning electron microscope.

FIG. 4 is a view illustrating an outline of an electrostatic chuck mechanism.

FIG. 5 is a flowchart illustrating a measuring process of the sample by the charged particle beam apparatus.

FIG. 6 is a flowchart illustrating the measuring process of the sample by the charged particle beam apparatus.

FIG. 7 is a flowchart illustrating the measuring process of the sample by the charged particle beam apparatus.

FIG. 8 is a flowchart illustrating the measuring process of the sample by the charged particle beam apparatus.

FIG. 9 is a time chart illustrating a change in a surface potential of the sample when a retarding voltage is applied.

DESCRIPTION OF EMBODIMENTS

An embodiment described below mainly relates to a scanning electron microscope including a sample stand having a contact pin and, particularly, relates to a scanning electron microscope including a sample stand or a negative voltage applying power supply applying a negative voltage (retarding voltage) to a sample.

In order to confirm conduction between the contact pin and the sample (wafer), it is conceivable to remove an insulation film of a contact portion between the contact pin and the sample in advance. In order to remove the insulation film of a surface of the sample, it is conceivable that laser is applied to the surface of the sample after reactive gas is introduced into a processing chamber, and thus a contact terminal comes into contact with a portion in which the insulation film is removed and a potential of the sample is stabilized. Thus, an effect that reduction of yield of a semiconductor device is suppressed is obtained without occurrence of foreign matter of the insulation film compared to a case where a pin having a sharp tip simply collides with the surface of the sample and a contact terminal comes into contact with the sample mechanically, and an electric charge is released.

On the other hand, for a measurement and inspection apparatus represented by a CD-SEM, a focus adjustment method that is a so-called retarding focus may be employed, in which a retarding voltage is applied to the wafer, which is the sample, by contacting some means, for example, a contact terminal to the wafer directly or interposing upper and lower surfaces of the wafer indirectly in a capacitive manner by a member of the same potential, the retarding voltage is set to an appropriate potential, and then the potential is finely adjusted and focused. Although either adjust the wafer potential in any manner is to be appropriately selected depending on a usage situation of the apparatus, if the contact terminal is used, it is a recognized advantage of not being affected charge of a periphery of a stage and the like.

In order to execute focusing by adjusting a wafer potential in the contact terminal and to inspect a plurality of measuring points within a wafer surface while maintaining a high throughput, it is necessary to complete adjustment of the retarding voltage in a short period of time. However, it was revealed by the study of the inventors of the present invention that if a contact resistance between the wafer and the contact terminal is great, since the time constant is great even if the retarding voltage is changed, responsiveness is poor, and thereby focusing may not be successfully performed. In order to avoid this, the insulation film of the surface of the sample is removed by applying laser is an effective method, but in practice, since a thickness of the insulation film is different for every sample, it is difficult to determine whether or not the insulation film is sufficiently removed. Furthermore, if the laser is excessively applied, the sample may be damaged.

As described above, in order to ensure conduction between the contact pin and the sample by using a function of removing an oxide film, it is necessary to find appropriate removing conditions corresponding to a thickness of the oxide film and the like. In the embodiment described below, a charged particle beam apparatus in which a contact state of the contact pin is appropriately grasped and appropriate apparatus conditions can be set is described.

In the embodiment described below, mainly, a charged particle beam apparatus is proposed in which the charged particle beam apparatus including a stage (sample stand) for holding a sample, the stage includes a contact terminal coming into elastic contact with the sample when the sample is loaded, the contact terminal is configured to connect to a retarding power supply for applying a retarding voltage to the sample, a time constant of a potential change is obtained by measuring a surface potential of the sample using a surface potential meter when the retarding voltage applied to the sample is changed, continuation or stop of execution of measurement or inspection by a charged particle beam is determined based on the time constant, or a focusing method is changed. According to such a configuration, even if focusing is performed by changing the retarding voltage, since the measurement or inspection cannot be performed with focus blur, it is possible to perform highly reliable measurement. Furthermore, in a case where an electrostatic chuck is employed as the stage, if a voltage applied to the electrostatic chuck is changed and a wafer potential in this time is measured by the surface potential meter, it is possible to determine whether or not the wafer and the contact terminal are conductive.

Furthermore, as another aspect to achieve the object described above, a charged particle beam apparatus is proposed in which the charged particle beam apparatus is provided with a unit for insulation breaking or removing an insulation film attached to the surface of the sample, the time constant of the potential change is obtained by measuring the surface potential of the sample with the surface potential meter when the retarding voltage applied to the sample is changed, and it is determined whether execution of measurement or inspection by the charged particle beam continues or the measurement or inspection continues while executing break of insulation or removing of the insulation film attached to the surface of the sample based on the time constant. According to such a configuration, it is possible to perform the measurement of the sample without depending on a situation of the insulation film of the surface of the sample or a contact state between the contact terminal and the sample, and it is possible to perform highly reliable measurement.

According to the configuration described above, it is possible to provide the charged particle beam apparatus in which a retarding potential can be changed with good responsiveness regardless of the thickness of the insulation film attached to the sample and it is possible to realize both high accuracy and high throughput of the measurement or the inspection.

Hereinafter, the charged particle beam apparatus will be described. In general, a basic principle of measurement will be briefly described taking a CD-SEM as an example. The CD-SEM is a type of the scanning electron microscope and has a function for measuring a wire width of a pattern of the semiconductor device and the like. Primary electrons are released from an electron gun and are accelerated by applying a voltage. Thereafter, a beam diameter of the electron beam is thinly focused by an electromagnetic lens. The sample such as the semiconductor wafer is two-dimensionally scanned with the electron beam. Secondary electrons generated by causing the scanned electron beam to enter the sample are detected by a detector. Since strength of the secondary electrons reflects a shape of the surface of the sample, scanning of the electron beam and detection of the secondary electrons are synchronized with each other, are displayed on a monitor, and thereby a fine pattern on the sample can be imaged. In the CD-SEM, for example, if the wire width of a gate electrode is measured, an edge of the pattern is determined based on a change in a contrast of the image that is obtained and dimensions are derived. The above description is the measurement principle of the CD-SEM.

Since the CD-SEM is used for measuring dimensions of a device pattern in a semiconductor manufacturing line, the throughput is very important as well as performance of the electron microscope such as resolution and length measurement reproducibility. As one of factors that adversely affect the performances of the apparatus, a problem of potential variation of the wafer exists. That is, there is the potential variation due to the fact that a surface of the electrostatic chuck for holding the wafer is charged, the potential variation caused by the electron beam applied to the wafer, the potential variation by discharging due to gas discharged from the wafer, and the like.

As a result, for example, if the wafer potential is varied during imaging the SEM image, image blur occurs and it causes deterioration of resolution or length measurement reproducibility. As a means for suppressing the potential variation, a method is disclosed in which a conduction member such as a terminal, a conduction pin, and the like that becomes an electrode is pressed against the wafer surface and the wafer potential is fixed through the conduction member. However, since there is a case where the insulation film having various thicknesses is attached to the wafer surface, unevenness may remain in the state of conduction.

As described above, if the insulation film of the wafer surface is removed by applying laser, it is possible to expect improvement of reproducibility of the state of conduction compared to a case of being pressed by the conduction pin, but since a required applying time is also varied by the thickness of the insulation film, it is also difficult to stably ensure the conduction.

Particularly, in an apparatus such as the CD-SEM developed in a mass production line of manufacturing the semiconductor, even in a case where any wafer flows in, it is important to measure the dimensions with good reproducibility and to continue the operation without lowering the throughput. For example, in a case where a retarding potential is applied to the wafer through the contact terminal and focusing is performed by adjusting the retarding potential, if a taking method (contact resistance) of the conduction is varied, since the time constant of focusing is great, image blur occurs. In order to perform the measurement with confidence without failure due to the image blur even in any wafer, a mechanism for verifying the contact resistance of the wafer and the contact terminal is required.

An example described below is provided in accordance with such a demand. In a scanning electron microscope in which the retarding voltage is applied by the contact terminal coming into contact with the wafer, and the SEM image is obtained and measured by executing focusing by adjusting the retarding voltage, the scanning electron microscope is described in which the wafer potential when changing the retarding voltage applied to the wafer is measured by the surface potential meter and the contact state between the wafer and the contact terminal can be determined from responsiveness thereof.

Furthermore, as another example, in a scanning electron microscope in which the retarding voltage is applied by the contact terminal coming into contact with the wafer, and the SEM image is obtained and measured by executing focusing by adjusting the retarding voltage, the scanning electron microscope is described in which a plurality of contact terminals are prepared, the conduction is ensured by applying a potential difference by a switching operation of a switch between the contact terminals, the wafer potential when the retarding voltage applied to the wafer is changed is measured by the surface potential meter, and the contact state between the wafer and the contact terminals can be determined from responsiveness thereof.

Furthermore, as another example, in a scanning electron microscope in which the retarding voltage is applied by the contact terminal coming into contact with the wafer, and the SEM image is obtained and measured by executing focusing by adjusting the retarding voltage, the scanning electron microscope is described in which the conduction is ensured by removing the insulation film by applying the laser beam to a rear surface of the wafer, the wafer potential when the retarding voltage applied to the wafer is changed is measured by the surface potential meter, and the contact state between the wafer and the contact terminal can be determined from responsiveness thereof.

More specifically, in a scanning electron microscope in which the retarding voltage is applied by the contact terminal coming into contact with the wafer, and the SEM image is obtained and measured by executing focusing by adjusting the retarding voltage, the scanning electron microscope is described in which a response time is obtained by measuring the wafer potential when the retarding voltage applied to the wafer is changed by the surface potential meter after the wafer is mounted on the stage such that the contact terminal comes into contact with the wafer and before the measurement is performed, and the contact state between the wafer and the contact terminal can be determined by comparing the response time with a threshold value of the response time that is determined in advance.

Furthermore, a scanning electron microscope is described in which a plurality of contact terminals coming into contact with the wafer are prepared, the conduction is ensured by applying a potential difference by a switching operation of a switch between the contact terminals, a response time is obtained by measuring the wafer potential when the retarding voltage applied to the wafer is changed by the surface potential meter after the wafer is mounted on the stage such that the contact terminals come into contact with the wafer and before the measurement is performed, and the contact state between the wafer and the contact terminals can be determined by comparing the response time with a threshold value of the response time that is determined in advance.

In addition, a scanning electron microscope is described in which the conduction can be ensured by removing the insulation film by applying the laser beam to a rear surface of the wafer, a response time is obtained by measuring the wafer potential when the retarding voltage applied to the wafer is changed by the surface potential meter after the wafer is mounted on the stage such that the contact terminal comes into contact with the wafer and before the measurement is performed, and the contact state between the wafer and the contact terminal can be determined by comparing the response time with a threshold value of the response time that is determined in advance.

According to the configuration described above, in the scanning electron microscope in which the SEM image is obtained and measured by using the electron beam, obtaining and dimensions measurement of the SEM image can be performed in a state where the image blur does not occur. Thus, it is possible to provide the scanning electron microscope having high reliability without reduction of resolution or deterioration of length measurement reproducibility.

Furthermore, according to another configuration described above, obtaining and dimensions measurement of the SEM image can be performed in a state where the image blur does not occur without receiving influence from a state of the insulation film of the rear surface of the wafer or a state of the front surface of the contact terminal. Thus, it is possible to provide the scanning electron microscope having high reliability without reduction of resolution or deterioration of length measurement reproducibility.

Hereinafter, a detailed configuration of the scanning electron microscope will be described with reference to drawings. Firstly, an outline of a CD-SEM 300 is described with reference to FIG. 3. An electron beam 303 that is extracted from an electron source 301 by an extracting electrode 302 and accelerated by an acceleration electrode (not illustrated) is focused by a condenser lens 304 that is a form of a focusing lens. Thereafter, a sample 9 built in a vacuum sample chamber 307 is one-dimensionally or two-dimensionally scanned with the electron beam 303 by a scanning deflector 305. The electron beam 303 is decelerated by a negative voltage applied to an electrode built in a sample stand 309, is focused by an objective lens 306, and then is applied to the sample stand 309. The sample stand 309 is configured to be capable of moving at least in an X-Y direction to apply beam to an arbitrary position of the sample.

If the electron beam 303 is applied to the sample 9, electrons 310 such as secondary electrons and backscattered electrons are emitted from an irradiation portion. The emitted electrons 310 are accelerated in a direction of an electron source by an acceleration operation based on the negative voltage applied to the sample, collide with a conversion electrode 312, and generate secondary electrons 311. The secondary electrons 311 emitted from the conversion electrode 312 are captured by a detector 313 and an output of the detector 313 is changed by a secondary electron amount that is captured. Brightness of a display device (not illustrated) is changed in response to the output. For example, if a two-dimensional image is formed, an image of a scanning region is formed by synchronizing a deflection signal to the scanning deflector 305 and the output of the detector 313. Furthermore, in the scanning electron microscope illustrated in FIG. 3, a deflector (not illustrated) moving the scanning region of the electron beam is provided. The deflector is used for forming an image of a pattern and the like of the same shape existed in a different position. The deflector is also called an image shift detector and allows a view field position of the electron microscope to be movable without performing a sample movement and the like by a sample stage. The image shift deflector and the scanning deflector are a common deflector, a signal for image shift and a signal for scanning are superimposed, and thereby the signal may be supplied to the deflector.

Moreover, in the example of FIG. 3, an example in which electrons emitted from the sample are detected by converting once by the conversion electrode is described, but of course, the scanning electron microscope is not limited to the example. For example, the scanning electron microscope may be configured such that an electron magnification image tube or a detection surface of the detector is disposed on an orbit of the accelerated electrons.

A control device 320 includes a function of controlling each configuration of the scanning electron microscope and of forming the image based on the detected electrons or a function of measuring a pattern width of a pattern formed on the sample based on intensity distribution of detected electrons called a line profile. Furthermore, the control device 320 controls a negative voltage applying power supply (retarding power supply) 321, the objective lens 306, and the like based on a recipe that is an operation program for automatically controlling the CD-SEM 300. Furthermore, the control device 320 controls the negative voltage applying power supply 321, the sample stand 309, and an electrostatic potential meter 34 so as to measuring a surface potential of the sample while applying the negative voltage to the sample 9 introduced from a preliminary exhaust chamber 323. More specifically, in a state where the sample stand 309 on which the sample 9 is mounted is positioned below the electrostatic potential meter 34, a predetermined voltage is applied from the negative voltage applying power supply 321 and the surface potential of the sample at this time is measured by the electrostatic potential meter 34.

Furthermore, the control device 320 performs focus adjustment using the negative voltage applying power supply 321 or the objective lens 306, or both the objective lens 306 and the negative voltage applying power supply 321 based on the detection signal obtained by the detector 313. Specifically, the control device 320 evaluates sharpness of the image formed based on the detection signal, selects lens conditions (applying voltage conditions of the negative voltage applying power supply 321 and excitation current conditions of the objective lens 306) of the highest sharpness or equal to or greater than predetermined conditions, and selects the conditions as apparatus conditions. Furthermore, if a sample in which appropriate evaluation is difficult is introduced, the control device 320 is configured such that the sample is carried out of the sample chamber or a measurement result of a fact that appropriate measurement may not be performed is output without performing the measurement of the sample.

Furthermore, although not illustrated, a wafer transport lift mechanism capable of moving vertically is provided so as to mount and demount a wafer (sample 9) on and from an electrostatic chuck (sample stand 309). The wafer transport lift mechanism can perform delivery of the wafer between the electrostatic chuck and the preliminary exhaust chamber 323 (load lock chamber) by a cooperative operation with a transport robot (not illustrated).

An operation when transporting the wafer that is an object to be measured to the electrostatic chuck is performed such that first, the wafer that is set in a wafer cassette is introduced into the preliminary exhaust chamber 323 by the transport robot of mini-environment. An inside of the preliminary exhaust chamber 323 can be evacuated and released to the atmosphere by a vacuum exhaust system (not illustrated) and the wafer is transported on the electrostatic chuck while maintaining the degree of vacuum on the inside of the vacuum sample chamber 307 at a level having practically no problem by opening and closing of a valve 324, and by an operation of the transport robot.

A flow of processing of the CD-SEM 300 up to the measurement using the electron beam after the wafer is mounted on the electrostatic chuck will be described with reference to FIGS. 1 and 2. Processing described below is executed by controlling each configuration element of the CD-SEM by the control device 320 according to a recipe. In the example, when the wafer 9 is mounted on a electrostatic chuck 10, a contact terminal 17 made of conductive diamond is disposed through a coil spring 36 such that a tip of the contact terminal 17 comes into elastic contact with the rear surface of the wafer. It is preferable that a radius of curvature of the tip of the terminal is sharp on the order of a few microns. Moreover, a material of the contact terminal is not limited to the conductive diamond and may be hard conductive ceramic or hard conductive resin.

The contact terminal 17 is connected to a retarding power supply 29 (negative voltage applying power supply 321) applying power to the stage and the retarding voltage is applied to the wafer if the conduction with the wafer is ensured. Internal electrodes 26 and 30 are embedded on the inside of the electrostatic chuck and the wafer 9 is electrostatically adsorbed by applying the voltage by DC power supplies 27 and 28.

The rear surface of the wafer may have the insulation film such as an oxide film or a nitride film and whether the conduction is ensured by coming into contact with the contact terminal is dependent on a shape of the tip of the contact terminal and a pressing force to the wafer. Thus, a spring constant of the coil spring is adjusted in advance to press the contact terminal with an appropriate pressing force such that the conduction can be stably ensured depending on the thickness of the insulation film of the rear surface of the wafer transported to the CD-SEM.

The surface potential meter 34 (surface potential measurement: SPM) is attached to a chamber wall 19 (upper wall of the vacuum sample chamber 307) of a home position (hereinafter, referred to as HP) where the wafer is transported to the electrostatic chuck in a position in which a representative potential of the wafer can be measured through a vacuum flange 20. Furthermore, a trap plate 18 capable of applying the retarding voltage while ensuring insulation with the chamber wall 19 is provided on the inside of the vacuum chamber. If the retarding voltage is applied to the electrostatic chuck by the retarding power supply 29, the wafer is interposed between both upper and lower surfaces with the retarding potential in an electrostatic capacitance manner.

If a pattern formed on the surface of the wafer is measured, since swell of the wafer, a pattern shape, and local charge exist, it is necessary to perform focusing. There are two methods for focusing. One is a method in which focusing is performed by changing the retarding voltage and adjusting the wafer potential. The other is a method in which focusing is performed by fixing the retarding voltage, changing a coil current of the objective lens, and adjusting convergence of the beam. Focusing being performed with any method can be appropriately selected depending on measuring conditions.

As the example, in a case of a method of directly applying the retarding voltage to the wafer with the contact terminal, if the conduction between the wafer and the contact terminal is appropriately ensured and the contact resistance is small, the method of adjusting the retarding potential can expect an advantage of good responsiveness. Furthermore, even in a case where the insulation film of the rear surface of the wafer as described above is thick and complete insulation is made even when the contact terminal comes into contact with the wafer, the electrostatic chuck and the trap plate are the retarding potential, and the wafer becomes the retarding potential by capacitive coupling. Thus, there is no problem for focusing with good responsiveness.

On the other hand, if the conduction between the wafer and the contact terminal is not sufficient, specifically, in a case where the contact resistance is great (typically several MΩ to several hundred MΩ), response delay may occur if the retarding potential is changed. For example, as the retarding voltage, in a case of the CD-SEM, typically, the retarding voltage is often approximately 0 V to 5 kV and responsiveness of a power supply output is designed to be several tens of milliseconds. However, if the contact resistance between the wafer and the contact terminal is great, the time constant of the potential variation of the wafer may occur for several seconds to several ten seconds.

In this case, if focusing is performed in retarding, the SEM image in which just focus is obtained and the retarding voltage at that time are deviated, and automatic focusing cannot be executed substantially. In a case where very slight image blur occurs, if dimension measurement is performed on the SEM image, a CD value may be greatly estimated. For example, an adjustment speed of the retarding voltage for focusing is slow in accordance with the time constant, time taking for measurement becomes long, and thereby the throughput is deteriorated.

Thus, it is important to confirm that the conduction can be ensured at a level having no problem by measuring the conduction state between the wafer and the contact terminal. If there is a level having a problem on the measurement, it is necessary to stop the measurement or to switch the focusing method. A sequence of a case where the measurement is stopped will be described with reference to FIG. 2.

First, after the wafer is mounted on the electrostatic chuck (40), a voltage is applied to the electrostatic chuck (41). Next, the retarding voltage is applied (42). According to the related art, thereafter, the stage is moved, the wafer is transported to a length measurement point, and dimensions are measured by obtaining the SEM image. On the other hand, in the example, the retarding voltage is changed only by a preset value (43) and the wafer potential at this time is measured by the SPM. Time resolution of the SPM is faster than responsiveness of the output of the retarding power supply, and the time constant of the change in the wafer potential is calculated (44) and is compared to a preset time constant (45). If the time constant is equal to or less than a reference value (45), the contact resistance is sufficiently small or it is entirely insulated, it is determined that auto focusing can be executed in retarding, and the measurement is started (46). If the time constant is greater than the reference value, it is determined that the contact resistance is great and auto focusing is not appropriate in retarding, the measurement is stopped (47), and an alarm is issued (48).

According to the CD-SEM including the function of the example, it is possible to prevent length measurement value variation due to dimension measurement in the image of a state that focus deviation is caused.

In the example, as processing if the time constant of the wafer potential is great, the measurement is stopped. However, the conduction may be ensured by transporting the wafer again depending on the contact state between the wafer and the contact terminal. In consideration of such a case, if the time constant is greater than the reference value, the wafer is transported once by the transport robot and is placed again on the electrostatic chuck. It is also possible to try the operation from the electrostatic chuck on (41) again and the number of the retry operation may be set in advance.

Next, a sequence for stopping the measurement will be described with reference to FIG. 7.

First, after the wafer is mounted on the electrostatic chuck (40), a voltage is applied to the electrostatic chuck (41). Next, the retarding voltage is applied (42). According to the related art, thereafter, the stage is moved, the wafer is transported to a length measurement point, and dimensions are measured by obtaining the SEM image. On the other hand, in the example, the retarding voltage is changed only by a preset value (43) and the wafer potential at this time is measured by the SPM. Time resolution of the SPM is faster than responsiveness of the output of the retarding power supply, the time constant of the change in the wafer potential is calculated (44), and is compared to a preset time constant (45). If the time constant is equal to or less than a reference value (45), the contact resistance is sufficiently small or it is entirely insulated, it is determined that auto focusing can be executed in retarding, and the measurement is started (46). If the time constant is greater than the reference value, it is determined that the contact resistance is great and auto focusing is not appropriate in retarding, a fixing value of the retarding voltage is set (81), and the objective lens is switched to a current adjustment mode (82), and the measurement is started (46).

According to the CD-SEM including the function of the example, it is possible to provide the CD-SEM capable of continuing measurement regardless of the contact state between the wafer and the contact terminal.

In fine dimension measurement, it is problematic in terms of reproducibility if the focusing method is known for each wafer. However, if there are applications in which this point is particularly no problem, it is possible to continue the measurement and to operate the apparatus without lowering the operation rate of the apparatus.

Moreover, in the example, a case where the measurement is continued by automatically determining the following operation using the reference value of the time constant is described, but a user grasps the situation, subjectively determines the situation, and can select the following measurement method. For example, typically, the measurement is performed by retarding autofocus and when it is abnormal, the recipe may be set such that whether the measurement is executed in an objective lens current adjustment mode can be preset.

In the example, it is determined whether or not the contact resistance between the wafer and the terminal is suitable for the retarding autofocus from the time constant of the potential variation of the wafer. However, for example, if a step for measuring the wafer potential when the voltage applied to the electrostatic chuck is changed is added, it is possible to determine whether the conduction is ensured or insulated. A sequence of this case will be described with reference to FIG. 8. First, after the wafer is mounted on the electrostatic chuck (90), a voltage is applied to the electrostatic chuck (91). Next, the retarding voltage is applied (92). Next, the retarding voltage is changed only by a preset value (93) and the wafer potential at this time is measured by the SPM. Time resolution of the SPM is faster than responsiveness of the output of the retarding power supply, the time constant of the change in the wafer potential is calculated (94), and is compared to a preset time constant (95). If the time constant is greater than the reference value, it is determined that the contact resistance is great and focusing is not appropriate with retarding, the measurement is stopped (96), and alarm is issued (97). If the time constant is equal to or less than the reference value, it is determined that the contact resistance is sufficiently small or the conduction is completely insulated, applying voltage of the electrostatic chuck is changed only by a preset value (98), and the wafer potential at this time is measured by the SPM (99). If the conduction between the wafer and the contact terminal is performed, the wafer potential maintains the retarding potential even if the voltage of the electrostatic chuck is changed. However, in a case of insulation, since the wafer potential is changed depending on the change in the voltage, it is possible to determine whether the conduction is performed. Thus, when the voltage of the chuck is changed, whether variation of the wafer potential is equal to or less than the reference value is compared (100), and if the variation of the wafer potential is equal to or less than the reference value, it is determined that the conduction is ensured and the measurement is started (101). If the variation of the wafer potential is equal to or greater than the reference value, the measurement is stopped (102), and alarm is issued (102).

If the CD-SEM includes the function of the example, it is possible to determine whether or not the measurement is started by determining the conduction state between the wafer and the contact terminal. Thus, for example, it is possible to provide the CD-SEM that can be stably operated even in conditions in which there is a problem that the wafer is remain-absorbed to the electrostatic chuck by charging of the wafer such as measurement conditions in which a beam current is very great.

Moreover, in the example, the measurement is stopped as the process of a case where the conduction failure is determined by measuring the potential variation of the wafer, but this does not necessarily need to be the case and the measurement may be also continued by changing the conditions of focusing.

As described above, the time constant of the surface potential of the sample when the retarding voltage and the like are applied is evaluated. If the time constant satisfies predetermined conditions (response speed is equal to or greater than a predetermined value), the retarding focus is selectively applied and otherwise, stop of the measurement, generation of error message, focus adjustment using the objective lens of a magnetic field type, and the like are executed. Thus, it is possible to achieve both the measurement of high accuracy and high throughput.

Moreover, an example in which it is determined whether or not the retarding focus is applied based on the calculation of the time constant is described in FIG. 2 and the like, but the determination is not limited to the example and, for example, after the retarding voltage is applied, the determination described above may be performed based on the measurement of the surface potential of the sample after a predetermined period of time. For example, as illustrated in FIG. 9, after a retarding voltage (Vr) 901 is applied, a surface potential (Vs) of the sample is measured after a predetermined period of time (Δt). If the surface potential of the sample is equal to or greater than a predetermined threshold value 904, the retarding focus is executed and if is less than the predetermined threshold value, the stop of the measurement or a change to the focus adjustment using the objective lens is executed. In the example of FIG. 9, in a case of a potential change 902, the retarding focus is executed and in a case of a potential change 903, apparatus conditions are set such that the retarding focus is not executed. Furthermore, the change in the surface potential of the sample is detected as shape information of a waveform and if the shape information satisfies predetermined conditions, the retarding focus may be executed.

Next, if the time constant of the wafer potential is out of the reference value, a case where the insulation film of the rear surface of the wafer is electrically insulate-broken down and the conduction is ensured will be described. FIG. 4 is a view illustrating a specific configuration of the electrostatic chuck and FIG. 5 is a flowchart illustrating a flow of processing of the CD-SEM 300 until the measurement is performed using the electron beam after the wafer is mounted on the electrostatic chuck illustrated in FIG. 4. Through holes are provided in two portions on the inside of the surface of the electrostatic chuck. The contact terminals 17 and 21 are respectively attached to the through holes so as to come into elastic contact with the rear surface of the wafer. The contact terminals apply the voltage between the terminals by switching a switch 22 using a DC power supply 23 and thereby the conduction can be performed by insulate-breaking down the insulation film attached to the rear surface of the wafer. Furthermore, connection of the retarding power supply to the contact terminals can be switched by an opening and closing operation of a switch 24.

Next, a sequence of the example will be described with reference to FIG. 5. First, in a state where the switch 24 is turned on and the switch 22 is switched to a, after the wafer is mounted on the electrostatic chuck (50), a voltage is applied to the electrostatic chuck (51). Next, the retarding voltage is applied (52).

If apparatus conditions setting is not performed based on a sample surface potential evaluation as the example, thereafter, the stage is moved, the wafer is transported to the length measurement point, and the dimensions are measured by obtaining the SEM image. On the other hand, in the example, the retarding voltage is changed only by a preset value (53) and the wafer potential at this time is measured by the SPM. Time resolution of the SPM is faster than responsiveness of the output of the retarding power supply, the time constant of the change in the wafer potential is calculated (54), and is compared to a preset time constant (55).

If the time constant is equal to or less than the reference value (55), the contact resistance is sufficiently small or it is entirely insulated, it is determined that auto focusing can be executed in retarding, and the measurement is started (56). If the time constant is greater than the reference value, it is determined that the contact resistance is great and auto focusing is not appropriate in retarding, and the process proceeds to the following sequence of conduction ensuring. First, the switch 24 is turned off (57) and the switch 22 is switched to b (58). Thereafter, the voltage that is preset is applied (59) by the DC power supply 23 and the conduction is ensured by insulate-breaking down the insulation film of the rear surface of the wafer. Thereafter, the switch 22 is switched to a (60), the switch 24 is turned on (61), the retarding voltage is changed again (53), and then the time constant of the wafer potential is measured.

Furthermore, if the time constant cannot be sufficiently small in a single conduction ensuring operation, the voltage applied between the terminals is increased by a predetermined amount and the conduction operation may be repeated. According to the CD-SEM of this system, the contact resistance between the wafer and the pin can be reliably maintained to be equal to or less than a constant level. Thus, focusing can be executed by the adjustment of the retarding voltage and it is possible to realize good length measurement of excellent reproducibility.

Moreover, in the example, the time constant is unbalanced, and the process proceeds to an operation to perform the conduction again, but retry is not necessarily required and, for example, the measurement may be stopped by determining that it is abnormality of the shape of the tip of the pin.

Next, an example in which determination whether or not an insulation film removing process is required is performed based on the time constant evaluation will be described. In the example, similar to the example of FIG. 1, the through hole is provided in the electrostatic chuck at one portion, and the contact terminal is disposed in the through hole and is connected to the retarding power supply. Furthermore, a laser beam source (not illustrated) and an observation window for introducing laser into the chamber are provided below the preliminary exhaust chamber 323. The laser beam source is disposed to apply the laser to the position of the rear surface of the wafer coming into contact with the contact terminal 17. As the type of the laser, YAG laser or UV laser having an output of approximately 1 W to 10 W is applied. A material of the observation window is appropriately selected so as to transmit laser. The position of a laser applying device is disposed in a position where a region in which the insulation film of the rear surface of the wafer is removed by the applied laser comes into contact with the contact terminal when the wafer is mounted on the electrostatic chuck. Thus, even if the insulation film exists on the rear surface of the wafer, it is possible to always suppress the contact resistance with the contact terminal to be small by the laser application and to manage the conduction state constantly every time.

FIG. 6 is a flowchart illustrating a measuring process including a determining process of whether or not removing of the insulation film using laser is required. First, after the wafer is mounted on the electrostatic chuck (70), a voltage is applied to the electrostatic chuck (71). Next, the retarding voltage is applied (72). Thereafter, the retarding voltage is changed only by a preset value (73) and the wafer potential at this time is measured by the SPM. Time resolution of the SPM is faster than responsiveness of the output of the retarding power supply, the time constant of the change in the wafer potential is calculated (74), and is compared to a preset time constant (75). If the time constant is equal to or less than the reference value (75), the contact resistance is sufficiently small or it is entirely insulated, it is determined that auto focusing can be executed in retarding, and the measurement is started (76). If the time constant is greater than the reference value, it is determined that the contact resistance is great and auto focusing is not appropriate in retarding, and the process proceeds to the following sequence of conduction ensuring. First, the wafer is taken out to a load lock chamber (77) and the laser beam is applied to the rear surface of the wafer with predetermined conditions (output, time, and region) by the laser applying device (78). Thereafter, the wafer is mounted on the electrostatic chuck again (70), the retarding voltage is changed as the last time (73), and the time constant of the wafer potential is measured. Furthermore, if the time constant cannot be sufficiently small in a single laser application, it is possible to execute removing of the insulation film by applying the beam again.

According to the CD-SEM of the system, it is possible to maintain the contact resistance between the wafer and the pin to be equal to or less than a constant level. Thus, focusing can be achieved by the adjustment of the retarding voltage and it is possible to realize length measurement of good reproducibility. Furthermore, a force pressing the pin is extremely reduced, and it is possible to suppress pins of the minimum number and to suppress the problem of foreign matters on the rear surface to the minimum.

Moreover, in the embodiment, applying of laser to the wafer is performed in the load lock chamber, but the configuration is not limited to the example and for example, the application can be performed in the mini-environment. Furthermore, a sample arrangement section within the preliminary exhaust chamber 323 is configured such that the voltage corresponding to the retarding voltage is capable of being applied. Thus, it is possible to appropriately perform the insulation film processing without effort that the wafer that is carried in the vacuum sample chamber 307 once is taken out to the preliminary exhaust chamber 323 and is carried in the vacuum sample chamber 307 again. Moreover, in this case, the electrostatic potential meter is disposed in the preliminary exhaust chamber 323.

In the example illustrated in FIGS. 5 and 6, the sequence in which typically, only conduction determination is performed and only when the time constant of the potential change is equal to or more than a constant value, the process proceeds to the operation of the conduction ensuring is described, but the configuration is not limited to the example and for example, it is possible to execute the operation of the conduction ensuring every time before the wafer is mounted on the electrostatic chuck. In this case, it is possible to expect an advantage of reducing generation of retry operation for the conduction ensuring.

Description of the example is provided in a case where all stages of the wafer employ the electrostatic chuck, but the stages are not necessarily the electrostatic chuck and for example, and the invention can be similarly applied to a holder-type stage or a mechanical clamping-type stage.

REFERENCE SIGNS LIST

17 . . . contact terminal, 18 . . . trap plate, 19 . . . chamber wall, 20 . . . vacuum flange, 21, 22, 23, 24, 25, 26, . . . internal electrode, 27 . . . DC power supply, 28 . . . DC power supply, 29 . . . retarding power supply, 30 . . . internal electrode, 300 . . . SEM, 301 . . . electron source, 302 . . . extracting electrode, 303 . . . electron beam, 304 . . . condenser lens, 305 . . . scanning deflector, 306 . . . objective lens, 307 . . . vacuum sample chamber, 309 . . . sample stand, 31s0 . . . electron, 311 . . . secondary electron, 312 . . . conversion electrode, 313 . . . detector, 320 . . . control device

The invention claimed is:

1. A charged particle beam apparatus comprising:
an objective lens for focusing a charged particle beam emitted from a charged particle source;
a sample stand for mounting a sample to which a charged particle beam focused by the objective lens is applied;
a voltage applying power supply for applying a voltage to the sample; and
a control device for controlling the objective lens and the voltage applying power supply,
wherein after the voltage is applied from the voltage applying power supply to the sample, the control device measures a surface potential of the sample after a predetermined period of time, a change in the surface potential of the sample after the voltage is applied, or a time constant, and stops measurement or inspection using the charged particle beam apparatus, or generates an error signal if the surface potential of the sample after the predetermined period of time, the information of the change in the surface potential of the sample after the voltage is applied, or the time constant does not satisfy the predetermined conditions.

2. The charged particle beam apparatus according to claim 1,
wherein the control device measures the surface potential of the sample after the predetermined period of time, the change in the surface potential of the sample after the voltage is applied, or the time constant, and executes focus adjustment using the objective lens if the surface potential of the sample after the predetermined period of time, the information of the change in the surface potential of the sample after the voltage is applied, or the time constant does not satisfy the predetermined conditions.

3. The charged particle beam apparatus according to claim 1, further comprising:
a removing mechanism for removing an insulation film of a rear surface of the sample,
wherein the control device measures the surface potential of the sample after the predetermined period of time, the change in the surface potential of the sample after the voltage is applied, or the time constant, and executes removing of the insulation film using the removing mechanism if the surface potential of the sample after the predetermined period of time, the information of the change in the surface potential of the sample after the voltage is applied, or the time constant does not satisfy the predetermined conditions.

4. The charged particle beam apparatus according to claim 3,
wherein the removing mechanism includes a plurality of contact terminals coming into contact with the rear surface of the sample and a power supply for generating a potential difference between the contact terminals.

5. The charged particle beam apparatus according to claim 3,
wherein the removing mechanism includes a laser beam source for applying laser to the rear surface of the sample.

6. The charged particle beam apparatus according to claim 1, further comprising:
a potential meter for measuring a potential of the sample,
wherein the control device determines whether or not the focus adjustment is executed using the voltage applying power supply based on the potential measured by the potential meter.

7. A charged particle beam apparatus comprising:
a stage for holding a sample,
wherein the stage includes a contact terminal coming into elastic contact with the sample when the sample is loaded, the contact terminal is connected to a retarding power supply for applying a retarding voltage to the sample, the charged particle beam apparatus includes a surface potential meter for measuring a surface potential of the sample, a potential variation of the sample when changing the retarding voltage is measured by the surface potential meter, and the charged particle beam apparatus includes a control device for controlling the charged particle beam apparatus such that continuation or stop of execution of measurement or inspection by the charged particle beam is determined based on a time constant of the potential variation.

8. A charged particle beam apparatus comprising:
a stage for holding a sample,
wherein the stage includes a plurality of contact terminals coming into elastic contact with the sample when the sample is loaded, a DC power supply is connected between the plurality of contact terminals so as to apply a potential difference, the plurality of contact terminals are connected to a retarding power supply for applying a retarding voltage to the sample, the charged particle beam apparatus includes a surface potential meter for measuring a surface potential of the sample, a potential variation of the sample when changing the retarding voltage is measured by the surface potential meter, and the charged particle beam apparatus includes a control device for controlling the charged particle beam apparatus such that execution of measurement or inspection by the charged particle beam is continued or an insulation film formed on a surface of the sample is insulation-broken by applying a voltage to the DC power supply based on a time constant of the potential variation.

9. A charged particle beam apparatus comprising:
a stage for holding a sample,
wherein the stage includes a contact terminal coming into elastic contact with the sample when the sample is loaded, the contact terminal is connected to a retarding power supply for applying a retarding voltage to the sample, the charged particle beam apparatus includes a surface potential meter for measuring a surface potential of the sample, the charged particle beam apparatus includes a laser applying device capable of applying laser in the vicinity of a surface of the sample coming into contact with the contact terminal, a potential variation of the sample when changing the retarding voltage is measured by the surface potential meter, and the charged particle beam apparatus includes a control device for controlling the charged particle beam apparatus such that execution of measurement or inspection by the charged particle beam is continued or an insulation film formed on the surface of the sample is removed by applying laser to the sample by the laser applying device based on a time constant of the potential variation.

* * * * *